United States Patent
Baars et al.

(10) Patent No.: US 8,222,103 B1
(45) Date of Patent: Jul. 17, 2012

(54) SEMICONDUCTOR DEVICE WITH EMBEDDED LOW-K METALLIZATION

(75) Inventors: Peter Baars, Dresden (DE); Till Schloesser, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/027,739

(22) Filed: Feb. 15, 2011

(51) Int. Cl.
*H01L 21/8242* (2006.01)
*H01L 29/94* (2006.01)

(52) U.S. Cl. ........ 438/239; 438/243; 438/386; 438/623; 257/301; 257/532; 257/700; 257/758; 257/E27.016; 257/E21.396; 257/E21.651

(58) Field of Classification Search .................. None
See application file for complete search history.

(56) References Cited

U.S. PATENT DOCUMENTS

| | | | |
|---|---|---|---|
| 6,215,144 B1 * | 4/2001 | Saito et al. | 257/310 |
| 6,406,968 B1 * | 6/2002 | Chien et al. | 438/381 |
| 6,821,846 B2 * | 11/2004 | Shao et al. | 438/253 |
| 6,852,628 B2 * | 2/2005 | Weber | 438/688 |
| 6,965,139 B2 * | 11/2005 | Ohno | 257/296 |
| 8,013,377 B2 * | 9/2011 | Baars et al. | 257/303 |
| 8,072,074 B2 * | 12/2011 | Hachisuka et al. | 257/758 |
| 2005/0051822 A1 * | 3/2005 | Manning | 257/296 |
| 2007/0045693 A1 * | 3/2007 | Manning et al. | 257/296 |
| 2010/0193853 A1 * | 8/2010 | Busch et al. | 257/306 |
| 2011/0117718 A1 * | 5/2011 | Nakamura et al. | 438/387 |

* cited by examiner

*Primary Examiner* — Alonzo Chambliss
(74) *Attorney, Agent, or Firm* — Williams, Morgan & Amerson, P.C.

(57) ABSTRACT

Generally, the subject matter disclosed herein relates to a semiconductor device with embedded low-k metallization. A method is disclosed that includes forming a plurality of copper metallization layers that are coupled to a plurality of logic devices in a logic area of a semiconductor device and, after forming the plurality of copper metallization layers, forming a plurality of capacitors in a memory array of the semiconductor device. The capacitors are formed using a non-low-k dielectric material (k value greater than 3), while the copper metallization layers are formed in layers of low-k dielectric material (k value less than 3). A semiconductor device is also disclosed which includes a plurality of logic devices, a memory array comprising a plurality of capacitors, a conductive contact plate coupled to the plurality of capacitors, and a plurality of copper metallization layers coupled to the logic devices, wherein the plurality of copper metallization layers are positioned at a level that is below a level of a bottom surface of the contact plate. A material other than a low-k dielectric material is positioned between the plurality of capacitors in the memory array.

24 Claims, 9 Drawing Sheets

SEMICONDUCTOR DEVICE WITH EMBEDDED LOW-K METALLIZATION

BACKGROUND

1. Field of the Disclosure

Generally, the present disclosure relates to sophisticated integrated circuits, and, more particularly, to a semiconductor device with embedded low-k metallization.

2. Description of the Related Art

In modern ultra-high density integrated circuits, device features have been steadily decreasing in size to enhance the performance of the semiconductor device and the overall functionality of the circuit. However, commensurate with the on-going shrinkage of feature sizes, certain size-related problems arise that may at least partially offset the advantages that may be obtained by simple size reduction alone. Generally speaking, decreasing the size of, for instance, circuit elements such as MOS transistors and the like, may lead to superior performance characteristics due to a decreased channel length of the transistor element, thereby resulting in higher drive current capabilities and enhanced switching speeds. Upon decreasing channel length, however, the pitch between adjacent transistors likewise decreases, thereby limiting the size of the conductive contact elements—e.g., those elements that provide electrical connection to the transistor, such as contact vias and the like—that may fit within the available real estate. Accordingly, the electrical resistance of conductive contact elements becomes a significant issue in the overall transistor design, since the cross-sectional area of these elements is similarly decreased. Moreover, the cross-sectional area of the contact vias, together with the characteristics of the materials they comprise, may have a significant influence on the effective electrical resistance and overall performance of these circuit elements.

Thus, improving the functionality and performance capability of various metallization systems has become important in designing modern semiconductor devices. One example of such improvements is the enhanced use of copper metallization systems in integrated circuit devices and the use of so-called "low-k" dielectric materials (materials having a dielectric constant less than 3) in such devices. Copper metallization systems exhibit improved electrical conductivity as compared to, for example, prior art metallization systems using tungsten for the conductive lines and vias. The use of low-k dielectric materials also tends to improve the signal-to-noise ratio (S/N ratio) by reducing crosstalk as compared to other dielectric materials with higher dielectric constants. However, the use of such low-k dielectric material can be problematic as they tend to be less resistant to metal migration as compared to some other dielectric materials.

Figure 1:
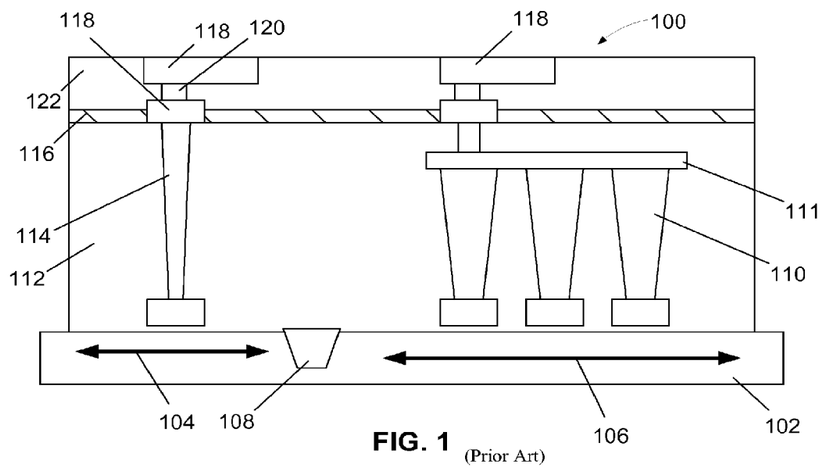
FIG. 1 schematically illustrates an illustrative prior art semiconductor device including a logic area and a memory array with a plurality of capacitor structures formed therein.

FIG. 1 is a simplified and schematic cross-sectional view of an illustrative semiconductor device 100, i.e., an illustrative eDRAM (embedded dynamic random access memory) device, for discussion purposes. As depicted therein, the eDRAM is formed in and above a substrate 102 and it generally includes a logic area 104, where various logic devices are formed, and a memory array 106, where various memory elements are formed. The logic area 104 and the memory array 106 are separated by an isolation structure, such as an illustrative trench isolation structure 108. The memory array 106 includes, among other things, a plurality of schematically depicted capacitors 110 (e.g., single sided capacitors) that are electrically coupled to a plate contact 111. The capacitors 110 are formed in a layer 112 of a non-low-k dielectric material (a material having a dielectric constant greater than 3), e.g., silicon dioxide, that is formed above the surface of the substrate 102. As is common, electrical connection to the logic area 104 of the device is made by an extended length contact 114. In the embodiment depicted in FIG. 1, the capacitors 110 in the memory array 106 are formed prior to forming the extended length contact 114.

An etch stop layer 116 is formed above the layer 112 and copper-based metallization components, e.g., metal lines 118 and vias 120, are formed to provide electrical connection to the logic area 104 and the memory array 106. The copper-based metallization components are formed in a dielectric material layer 122 that is typically comprised of a low-k material to enhance the performance of the copper-based metallization components. Typically, the extended length contact 114 is comprised of a conductive material such as tungsten. The aspect ratio of the extended length contact 114 is typically very high and may be on the order of 15-20. Such high aspect ratio openings cannot be readily filled with copper. Moreover, given the difficulty in filling high aspect ratio openings with any material, the aspect ratio of the opening for the extended length contact 114 tends to limit the height of the capacitors 110 in the memory array 106.

There are several undesirable aspects of the illustrative device 100 depicted in FIG. 1. First, the use of the non-copper extended length contact 114 may reduce the operating efficiency of the device 100 as compared to how the device 100 would operate if copper could be used for the extended length contact 114. Additionally, the use of the higher k dielectric material in the layer 112, which tends to be helpful as it relates to the performance of the capacitors 110, tends to be detrimental as to the signal-to-noise ratio of the device 110.

The present disclosure relates to methods and devices for avoiding or at least reducing the effects of one or more of the problems identified above.

SUMMARY OF THE DISCLOSURE

The following presents a simplified summary of the present disclosure in order to provide a basic understanding of some aspects disclosed herein. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the subject matter disclosed herein relates to a semiconductor device with embedded low-k metallization and methods of making such a device. A method is disclosed that includes forming a plurality of copper metallization layers that are conductively coupled to a plurality of logic devices in a logic area of a semiconductor device and, after forming the plurality of copper metallization layers, forming a plurality of capacitors in a memory array of the semiconductor device. In one illustrative embodiment, the capacitors are formed in such a manner that there is no low-k dielectric material (k value less than 3) present between the individual capacitors and a trench surrounding the memory array, while the copper metallization layers in the logic area are formed in layers of low-k dielectric material.

A semiconductor device is also disclosed which includes an area comprising a plurality of logic devices, a memory array comprising a plurality of capacitors, a conductive contact plate conductively coupled to the plurality of capacitors, and a plurality of copper metallization layers conductively coupled to the logic devices, wherein the plurality of copper metallization layers are positioned at a level that is below a level of a bottom surface of the conductive contact plate.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2:
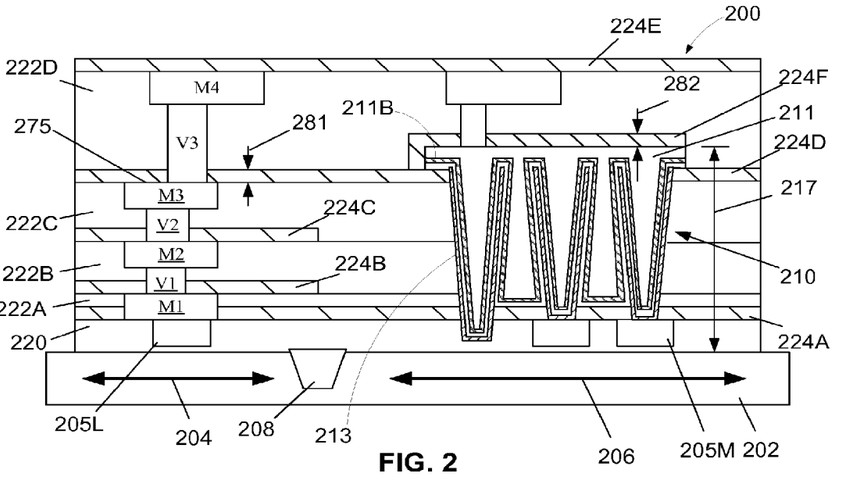
FIG. 2 schematically depicts one illustrative embodiment of a semiconductor device disclosed herein.

FIG. 2 depicts one illustrative embodiment the novel semiconductor device 200 disclosed herein. In the depicted embodiment, the illustrative device 200 is an eDRAM (embedded dynamic random access memory) with a plurality of illustrative double sided capacitors 210 formed in the memory array 206 of the device 200. Of course, those skilled in the art, after a complete reading of the present application, will readily appreciate that the inventions disclosed herein are not limited in application to semiconductor devices employing double sided capacitors. For example, the present disclosure may be readily adapted to use with semiconductor devices employing single sided capacitors with certain process flow modifications, such as additional etching and deposition steps that are not specifically depicted herein.

As shown in FIG. 2, the semiconductor device 200 includes a logic area 204 and a memory array 206 formed in and above an illustrative substrate 202 that are separated by an illustrative isolation structure, such as an illustrative trench isolation structure 208. A plurality of illustrative double sided capacitors 210 are formed in the memory array 206 and they are conductively coupled to a conductive contact plate 211. A trench 213 comprising a conductive material surrounds the capacitors 210 in the memory array 206. In one embodiment, the trench 213 is filled with the conductive material layers and the dielectric layer used to make the capacitors 210 as well as the conductive material that is used to make the conductive contact plate 211. The device 200 also comprises a plurality of copper-based metallization layers, i.e., lines (M1-M4) and vias (V1-V3). In the depicted embodiment, the device 200 comprises four illustrative copper metallization layers (M1-M4; V1-V3). However, as will be understood by those skilled in the art after a complete reading of the present application, the present invention is not limited to any specific number or metallization layers. The device 200 comprises a first dielectric layer 220, a plurality of low-k dielectric layers (222A-D) (made from a material having a dielectric constant (k) value less than 3) and a plurality of etch stop layers 224A-E. The copper-based metallization layers M1-M4 are electrically coupled to contacts 205L in the logic array 204. The capacitors 210 are electrically coupled to illustrative contacts 205M in the memory array 106. As depicted in FIG. 2, the copper-based metallization layers M1-M3 effectively replace the extended length contact 114 depicted in the prior art device 100 shown in FIG. 1. Additionally, in the novel device depicted in FIG. 2 and described herein, the metallization layers M1-M3 are formed in the layers 222A-C of low-k dielectric material, as compared to the extended length contact 114 in the prior art semiconductor device 100, wherein the extended length contact 114 was formed in a layer of material having a higher dielectric constant, e.g., silicon dioxide. Additionally, the capacitors 210 within the memory array 206 are formed using non-low-k materials, i.e., materials having a dielectric constant greater than 3, while, as noted above, low-k dielectric materials are used in the logic area 204. Stated another way, in one illustrative embodiment, the capacitors 210 are formed in such a manner that there is no low-k dielectric material (k value less than 3) present between the individual capacitors 210 and the trench 213 surrounding the memory array 206, while the copper metallization layers in the logic area 204 are formed in layers of low-k dielectric material.

In the device 200, the capacitors 210 are formed after the metallization layers M1-M3 are formed in the logic area 204. The copper metallization layers M1-M4 may be formed using traditional well-known techniques for forming copper lines and vias, e.g., a damascene technique. In the device disclosed herein, since there is no high aspect ratio opening to fill in the logic area (for the extended length contact 114), the number of metallization layers below the bottom 211B of the conductive contact plate 211 for the capacitors 210, layers M1-M3 in the depicted embodiment, may be increased to any desired number since the capacitors 210 are formed after the metallization layers in the logic area 204. Thus, in the device 200 disclosed herein, the height 217 of the capacitors 210 may be as large as needed to meet the electrical requirements of the device 200. Additionally, using the novel techniques disclosed herein, a number of the metallization layers, e.g., M1-M3, may have a collective height that is less than the height of the bottom surface 211B of the conductive contact plate 211.

Figure 3A:
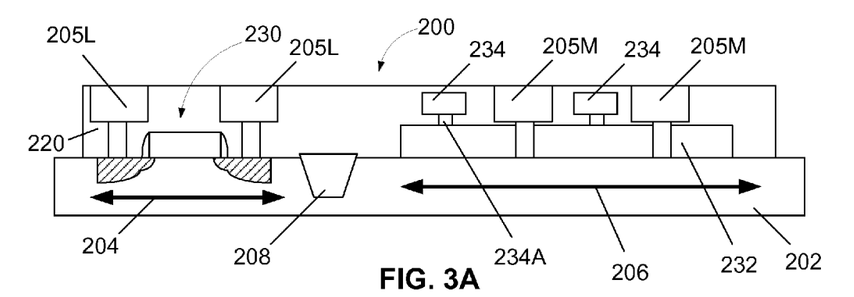
FIGS. 3A-3Q depict one illustrative process flow for forming the semiconductor device disclosure herein.
Figure 3B:
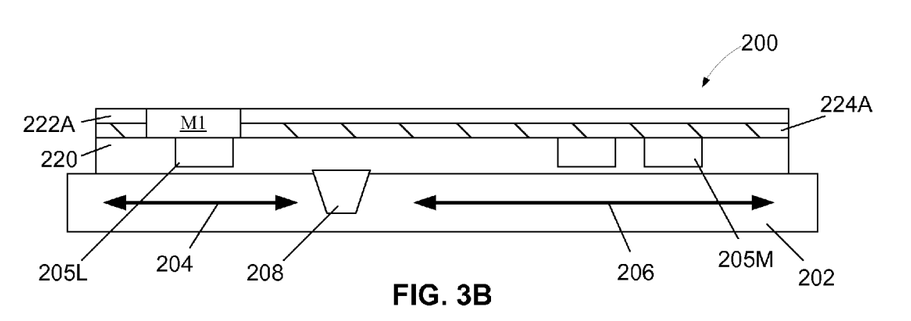
Figure 3C:
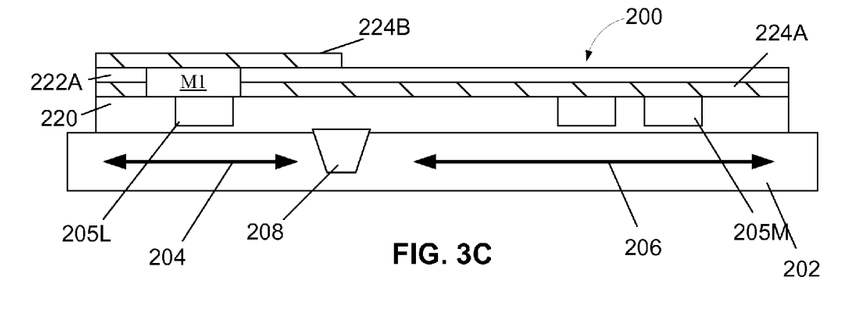
Figure 3D:
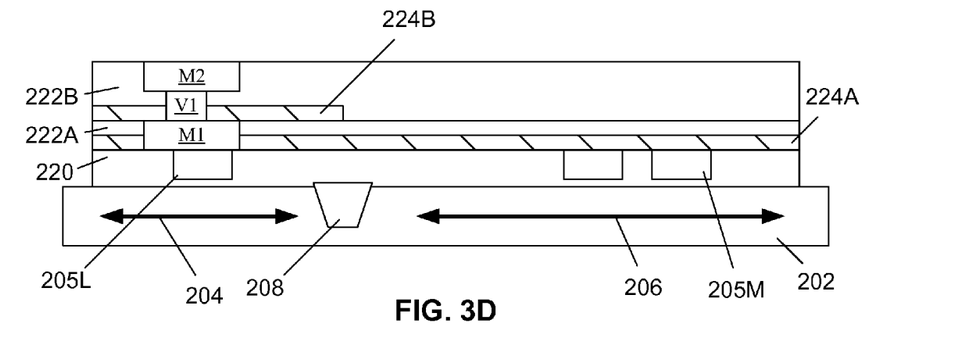
Figure 3E:
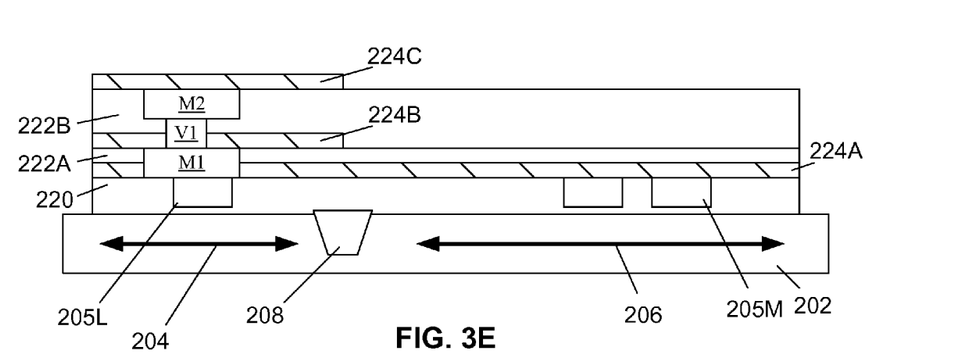
Figure 3F:
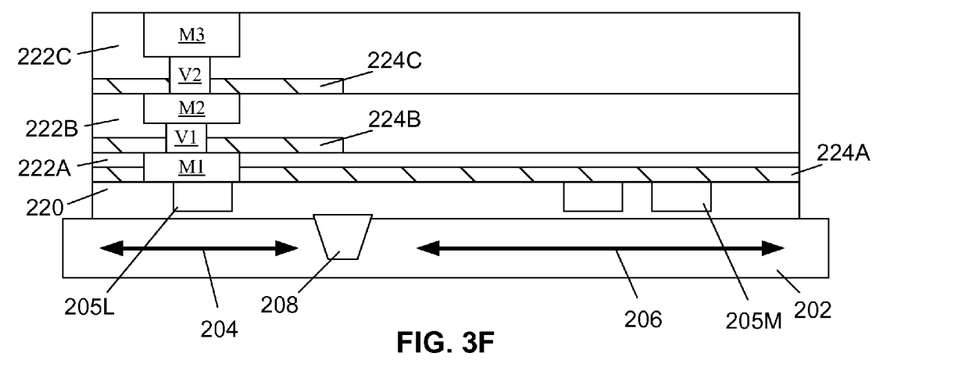
Figure 3G:
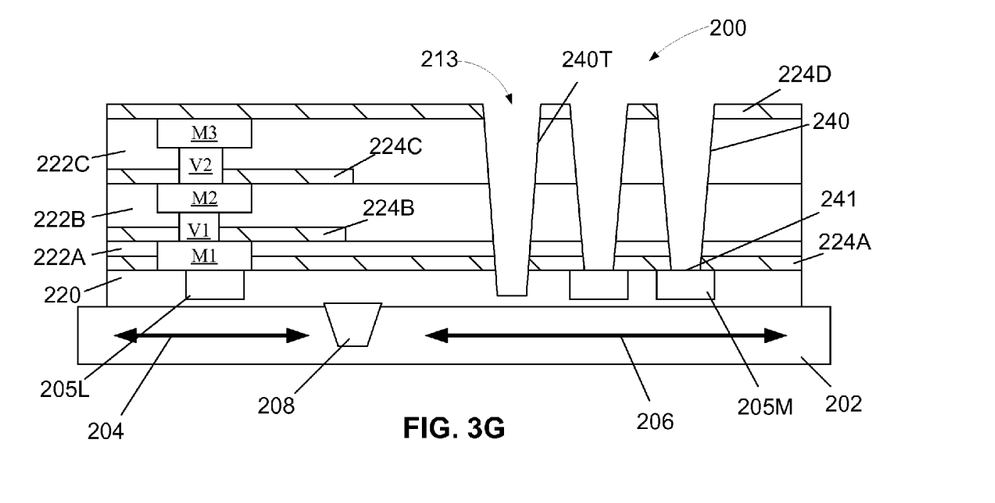
Figure 3H:
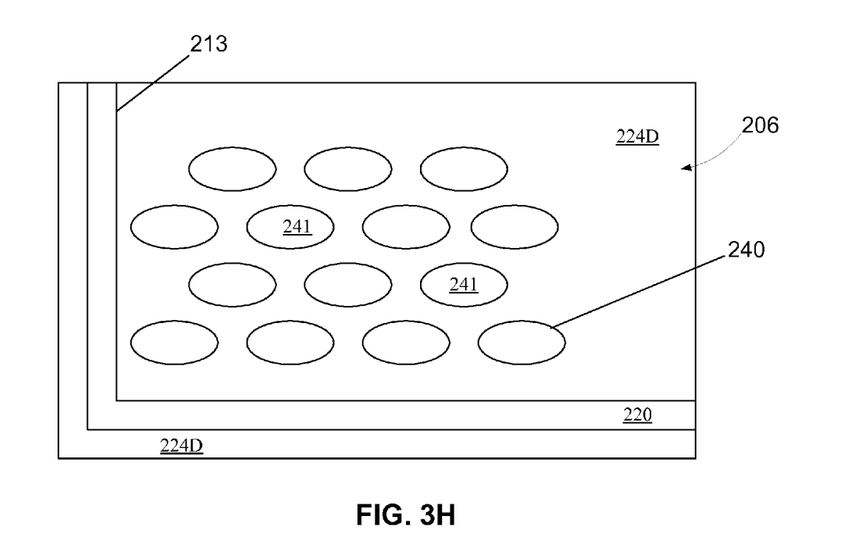
Figure 3I:
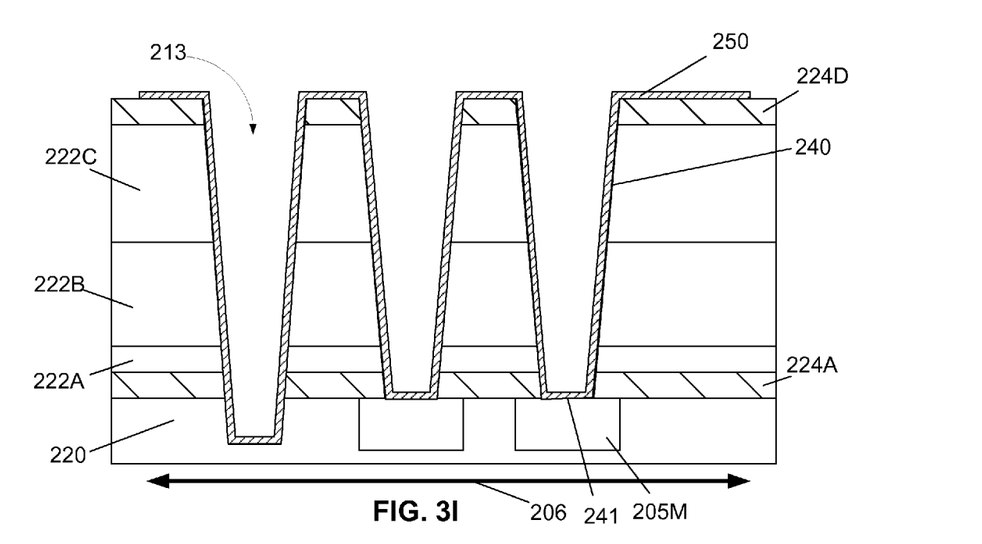
Figure 3J:
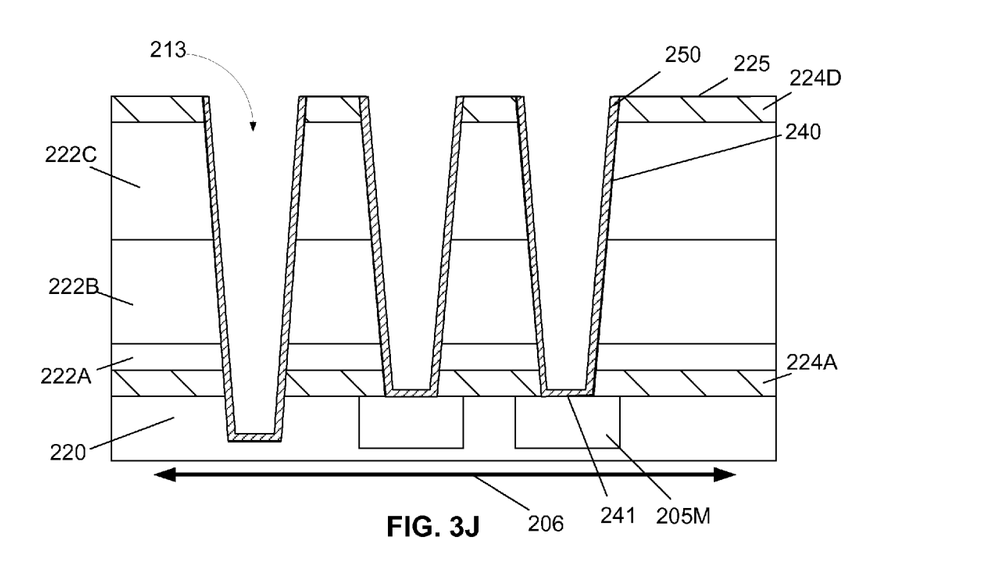
Figure 3K:
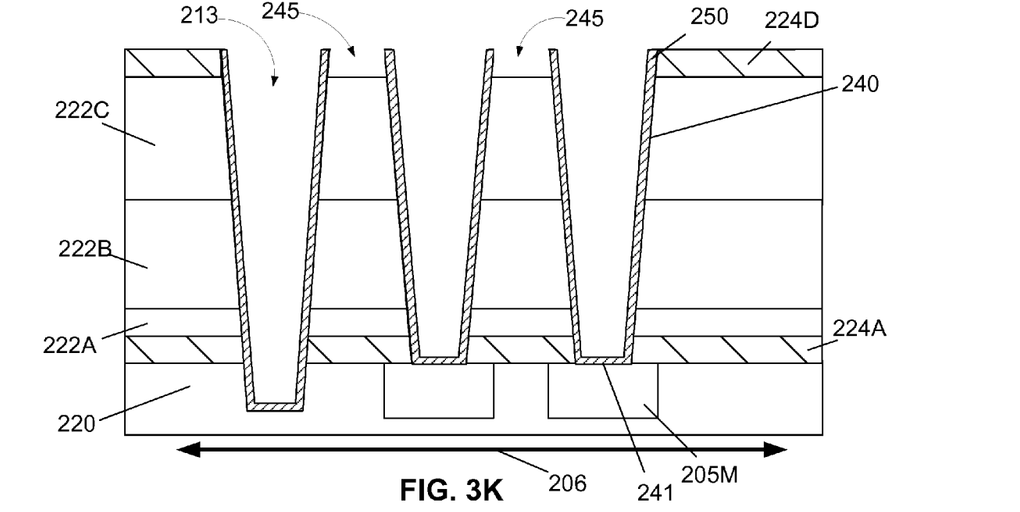
Figure 3L:
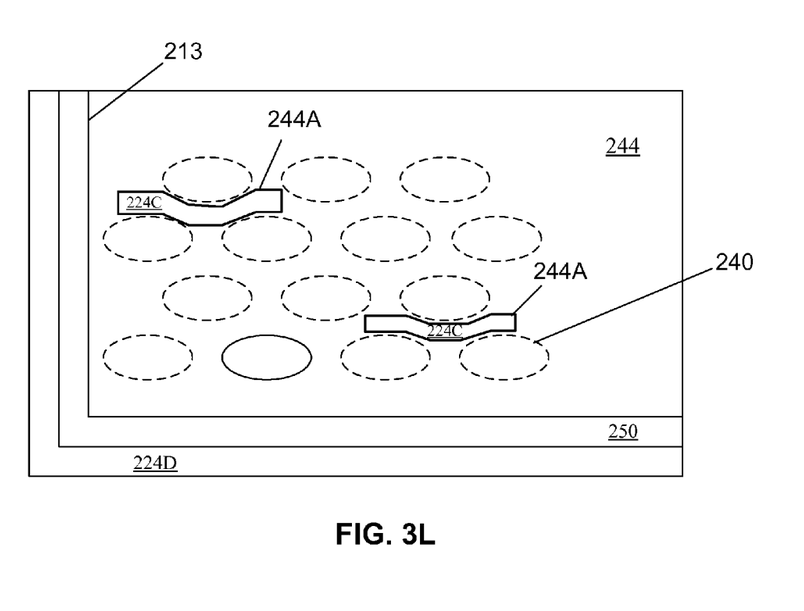
Figure 3M:
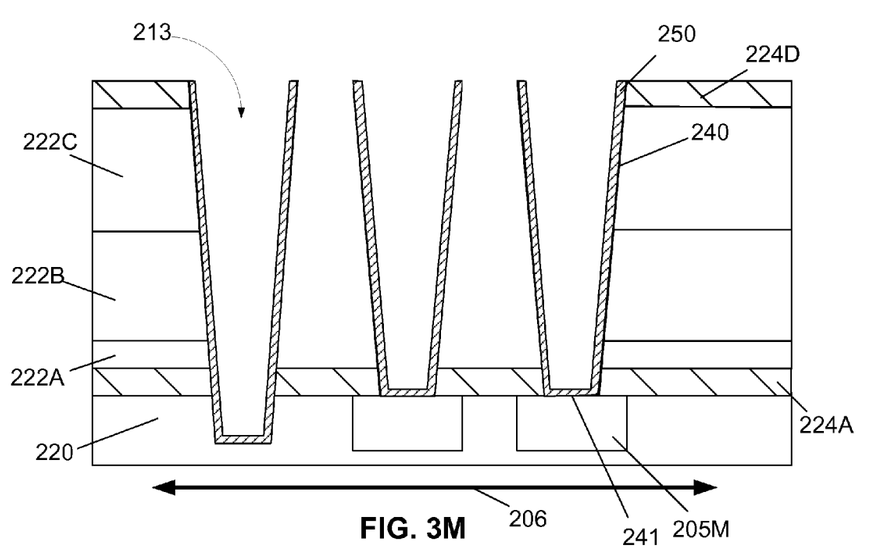
Figure 3N:
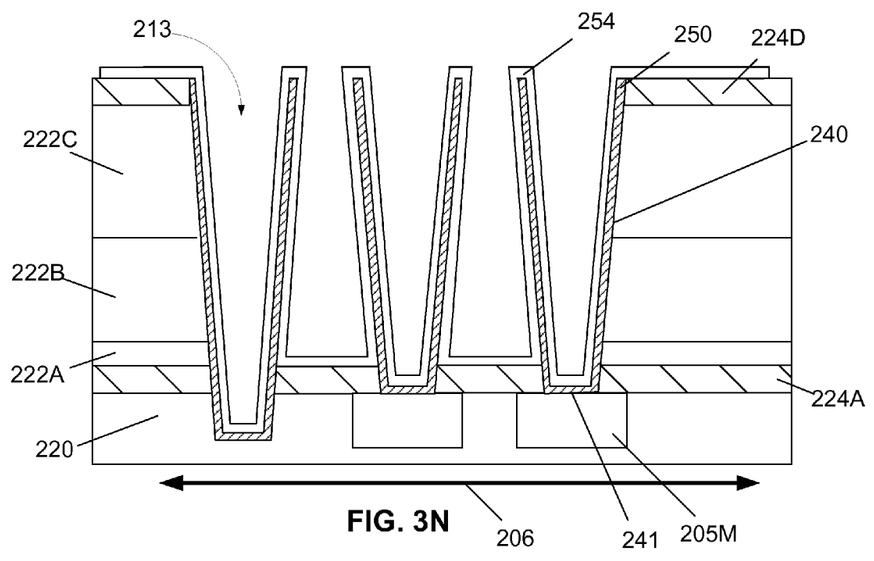
Figure 3O:
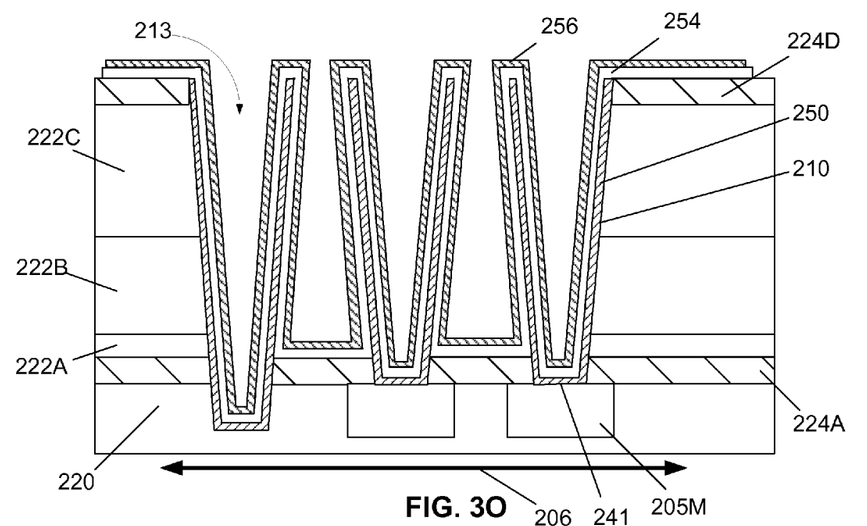
Figure 3P:
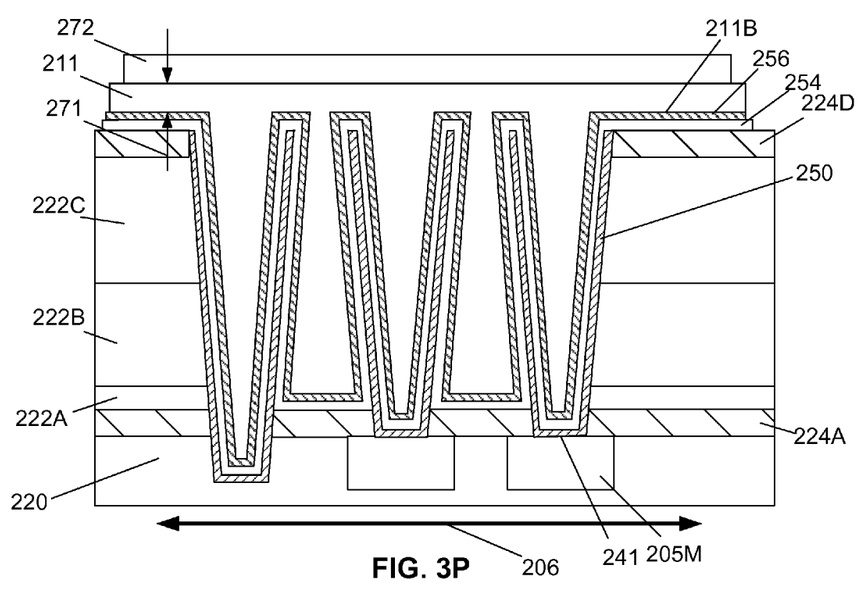
Figure 3Q:
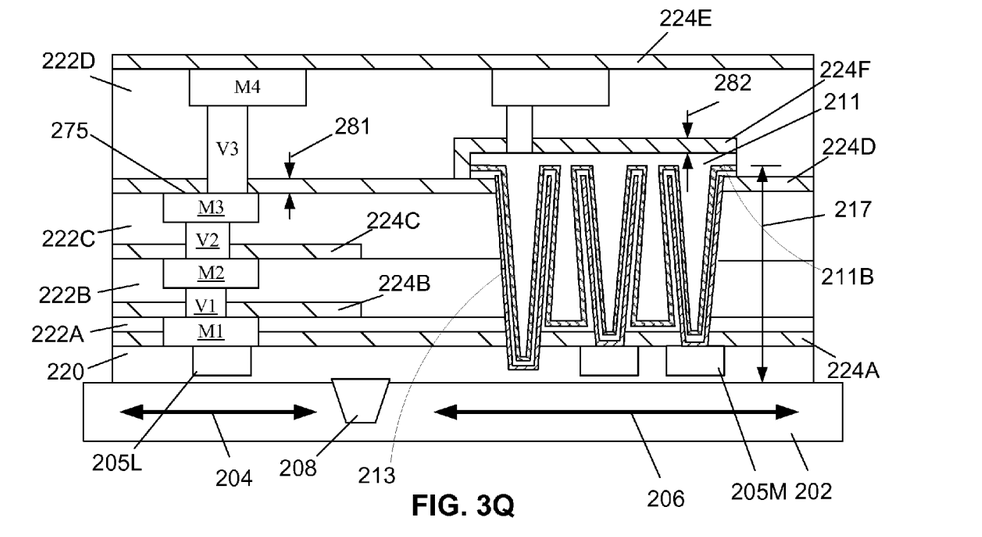

FIGS. 3A-3Q depict one illustrative process flow for forming the illustrative semiconductor device 200 disclosed herein. FIG. 3A is a schematic, cross-sectional view of the semiconductor device 200 disclosed herein at an early stage of manufacture. As shown therein, the device 200 includes the logic area 204 and the memory array 206 that are separated by an isolation structure, such as a shallow trench isolation 208. An illustrative transistor 230, with source/drain regions, is schematically depicted in the logic area 204. An illustrative word line 232 is depicted in the memory array 206. Also depicted in FIG. 3A are a plurality of contacts 205L in the logic area 204 and a plurality of contacts 205M in the memory array 206. Also depicted are a plurality of bit lines 234 and bit line contacts 234A in the memory array 206. Only the contacts 205L, 205M will be shown in subsequent drawings so as not to obscure the present invention. Additionally, for clarity, only a single contact 205L in the logic area 204 is shown in the subsequent drawings. As will be recognized by those skilled in the art after a complete reading of the present application, the present invention may be employed in forming metallization layers to all or substantially all of the contacts 205L in the logic area 204. Moreover, the illustrative transistor 230 is not the only type of device to which such contacts may be made in the logic area 204. Thus, the schematic and simplified depictions herein of a limited number of contacts 205L and 205M, and the illustrative transistor 230, should not be considered to be a limitation of the present invention.

FIG. 3B depicts the semiconductor device 200 after several process steps have been performed. In general, as disclosed herein, the present disclosure involves a method that includes, among other things, forming the capacitors 210 in the memory array 206 after the copper metallization layers, e.g., M1-M3 in the depicted embodiment, have been formed in the logic area 204. Moreover, using the methods disclosed herein, the copper metallization layers M1-M3 may be formed in low-k dielectric materials, such as the low-k dielectric layers 222A-C, and the capacitors 210 are formed using non-low-k dielectric material in the memory array 206. As noted earlier, in one example, the capacitors 210 are formed in such a manner that there is no low-k dielectric material (k value less than 3) present between the individual capacitors 210 and the trench 213, while the copper metallization layers, e.g., M1-M3 in the logic area 204 are formed in layers of low-k dielectric material. Additionally the methods disclosed herein include removing portions of the etch stop layers 224B, 224C that extend into the memory array 206, while leaving portions of the etch stop layers 224B, 224C in the logic area 204 in place. The removal of portions of the etch stop layers 224B, 224C may be accomplished by well-known matching and etching techniques.

As shown in FIG. 3B, the process involves the formation of a first dielectric layer 220 in the logic area 204 and the memory array 206 adjacent the contacts 205L, 205M. The first dielectric layer 220 may be comprised of any non-low-k material, e.g., silicon dioxide, having a dielectric constant greater than 3. The first dielectric layer 220 may be comprised of a material that is selectively etchable with respect to the etch stop layers 224A-C. In one illustrative embodiment, the first dielectric layer 220 may be silicon dioxide, and it may have a thickness of 50-250 nm, depending on the height of the transistor gate electrode and the height of the contacts. The etch stop layers 224A-E may be comprised of a material that is selectively etchable with respect to the low-k layers 222A-D and the first dielectric layer 220. In one illustrative embodiment, the etch stop layers 224A-E may be silicon nitride, silicon carbide, BLOCK™, or other similar materials, and they each may have a thickness of 10-50 nm. The low-k dielectric layers 222A-E may be comprised of a material that is selectively etchable with respect to the etch stop layers 224A-E and the first dielectric layer 220. In one illustrative embodiment, the low-k dielectric layers 222A-D may be comprised of carbon-doped silicon oxide, and they may have a thickness of 200-600 nm. The etch stops layers 224A-E need not all be of the same material or the same thickness. Similarly, the low-k dielectric layers 222A-D need not all be of the same material or the same thickness. The first dielectric layer 220, the etch stop layers 224A-E and the low-k dielectric layers 222A-D may be formed using a variety of known deposition techniques, such as chemical vapor deposition (CVD), plasma enhanced chemical vapor deposition (PECVD), atomic layer deposition (ALD), etc.

FIG. 3B depicts the semiconductor device 200 at the point of fabrication wherein the first dielectric layer 220 has been deposited adjacent the contacts 205L, 205M and thereafter been subjected to a planarization process, such as chemical mechanical polishing. The etch stop layer 224A and the low-k layer 222A are then formed above the first dielectric layer 220. The copper-based metallization M1, e.g., a metal line, is then formed on the device 200 using any of a variety of known techniques for forming conductive lines and vias comprising copper, e.g., a damascene technique, all of which are well known to those skilled in the art. So as not to obscure the present invention, details such as barrier layers and the like that are normally associated with such copper based metallization systems are not depicted in the drawings. Note the etch stop layer 224A is not removed in the memory array 206.

Next, as shown in FIG. 3C, the etch stop layer 224B is formed above the memory array 206 and the logic area 204 using known techniques, and subsequently removed in the area above the memory array 206 by performing known masking and etching techniques. So as not to obscure the present invention, the mask (e.g., photoresist) used to pattern the etch stop layer 224A is not shown.

Then, as shown in FIG. 3D, the low-k layer 222B is formed and the subsequent metallization layer, M2 and V1 are formed in the low-k layer 222B, with the via V1 extending through the etch stop layer 224B to conductively contact the metal line M1. Again, the copper-based metallization structures, e.g., line M2 and via V1, are formed using well-known techniques for forming such structures.

Next, as shown in FIG. 3E, the etch stop layer 224C is formed above the memory array 206 and the logic area 204 using known techniques, and subsequently removed in the area above the memory array 206 by performing known masking and etching techniques. Again, so as not to obscure the present invention, the mask (e.g., photoresist) used to pattern the etch stop layer 224C is not shown.

Then, as shown in FIG. 3F, the low-k layer 222C is formed and the subsequent metallization layer, M3 and V2 are formed in the low-k layer 222C, with the via V2 extending through the etch stop layer 224C to conductively contact the metal line M2. Again, the copper-based metallization structures, line M3 and via V2, are formed using well-known techniques for forming such structures.

Next, as shown in FIGS. 3G and 3H (partial plan view of the memory array 206), the etch stop layer 224D is formed above the memory array 206 and the logic area 204 using known techniques. Thereafter, a plurality of openings 240 and a surrounding trench 213 are formed in and adjacent to the memory array 206 using known masking and etching techniques. The mask and associated etching steps are not depicted so as not to obscure the present invention. The openings 240 will be used in forming the capacitors 210 in the memory array 206. The size, shape, height and layout of the openings 240, and thus the capacitors 210, may vary depending on the particular application and the desired or required capacitance needed for the device 200. In the illustrative example depicted herein, the openings 240 have an approximately oval configuration in the plan view (see FIG. 3H), and they are arranged in staggered rows and columns configuration as depicted in FIG. 3H. Note that the openings 240 are formed by etching through the etch stop layer 224D, the low-k dielectric layers 222A-C and the etch stop layer 224A. This may be accomplished by performing known etching techniques, e.g., dry anisotropic etching techniques, and it may be accomplished by performing one or more etching steps. As a result of the process, the surface 241 of the contacts 205M is exposed within each of the openings 240. The trench 213 may be of any size, shape or configuration in plan view. In the illustrative example depicted herein, the trench 213 has a generally rectangular configuration. In forming the trench 213, the over etching performed when etching through the etch stop layer 224A should be accurately controlled such that the opening for the trench 240T does not extend all the way through the first dielectric layer 220 and perhaps damage structures underlying the first dielectric layer 220. When the trench 214 is ultimately filled with, for example, various conductive and insulating materials, it will serve to effectively isolate that capacitor 210 from the other surrounding structures, such as the logic area 204. As will be recognized by those skilled in the art, the trench 213 does not play any appreciable role in the electrical performance or characteristics of the capacitors 210.

In FIGS. 3I-3P, only the memory array 206 portion of the device 200 will be depicted to facilitate discussions of the steps used to form the double sided capacitors 210. Additionally, the substrate 202 will be deleted from these views as well. As noted previously, double sided capacitors and the manner in which they are formed are well known to those skilled in the art. Thus, the particular methods and structures disclosed herein for forming such capacitors are provided by way of example only and they should not be considered to be a limitation of the present invention.

As shown in FIG. 3I, a first conductive layer 250 is formed in the memory array 206 and particularly in the openings 240, 240T. The first conductive layer 250 may be comprised of any of a variety of conductive materials and it may be formed by a variety of techniques. In one illustrative embodiment, the first conductive layer 250 may be titanium nitride, and it may be formed by and ALD process to a thickness of 5-15 nm. This first conductive layer 250 covers the sides of the openings 240, 240T, and contacts the surface 241 of the contacts 205M in the memory array 206.

Next, as shown in FIG. 3J, the portions of the first conductive layer 250 above the top surface 225 of the etch stop layer 224D are removed. This may be accomplished by performing a known etching and/or planarization method, such as chemical mechanical polishing (CMP).

Next, as shown in FIGS. 3K and 3L (partial plan view), various steps are performed to remove the low-k dielectric material, e.g., layers 222A-C, within the memory array 206. This involves the formation of a mask 244 (shown in FIG. 3L only) above the etch stop layer 224D. The mask 244 covers the openings 240, 240T and includes a plurality of illustrative mask openings 244A (only two of which are depicted) that exposed the underlying etch stop layers 224D. The material for the mask 224, as well as the number, size and shape of the mask openings 244A, may vary depending on the applications. Then, an etching process is performed on the etch stop layer 224D in the area above the memory array 206 to selectively remove the portions of the etch stop layer 224D that are exposed by the mask opening 244A, while permitting other portions of the etch stop layer 224D above the memory array 206 to remain intact. The remaining portions of the etch stop layer 224D above the memory array 206 serve to provide mechanical strength to the up-standing portions of the first conductive layer 250 during subsequent processing. The etching process removes the exposed portion of the etch stop layer 224D selectively with respect to the first conductive layer 250, as indicated in the areas 245. As a result of the etching process as shown in FIG. 3L, the low-k dielectric material 224C on the outside of the openings 240 in the memory array 206 is exposed for further etching and removal, as described more fully below.

Next, as shown in FIG. 3M, a wet etching process is performed to remove the low-k dielectric material, e.g., the layers 222A-C, in the memory array 206 inside the trench 213. A wet etching process is used so that the acid will flow through the openings formed in the etch stop layer 224D during the etch process described above and contact substantially all of the low-k dielectric material in the memory array 206. Again, during this etching process, the remaining portions of the etch stop layer 224D remain in place to provide mechanical support to the up-standing portions of the first conductive layer 250 that will ultimately become part of the capacitors 210. The surrounding trench 240T, 213 effectively prevents the wet chemistry from etching away the layers 222A-D in the logic area 204.

Thereafter, as shown in FIG. 3N, a first capacitor insulating layer 254 is formed in the memory array 206 and particularly in the openings 240 and the surrounding trench 213. The first capacitor insulating layer 254 may be comprised of any of a variety of non-low-k insulating materials and it may be formed by a variety of techniques. In one illustrative embodiment, the first capacitor insulating layer 254 may be a high-k dielectric material (k value greater than 10) such as hafnium oxide or zirconium oxide. The first capacitor insulating layer 254 may be formed by, for example, an ALD process and it may have a thickness of 2-10 nm. Note that this first capacitor insulating layer 254 covers both sides of the up-standing portions of the first conductive layer 250.

Thereafter, as shown in FIG. 3O, a second conductive layer 256 is formed in the memory array 206 on the first capacitor insulating layer 254. The second conductive layer 256 may be comprised of any of a variety of conductive materials and it may be formed by a variety of techniques. In one illustrative embodiment, the second conductive layer 256 may be comprised of titanium nitride, and it may be formed by an ALD process to a thickness of 5-15 nm.

Thereafter, as shown in FIG. 3P, a conductive contact plate 211 is formed in the memory array 206 on the second conductive layer 256 and substantially fills the memory array 206. The conductive contact plate 211 may be comprised of any of a variety of conductive materials and it may be formed by a variety of techniques. In one illustrative embodiment, the conductive contact plate 211 may be comprised of tungsten, and it may be formed by a CVD process to a thickness 271 of 50-150 nm. A mask layer 272 is formed over the conductive contact plate 211 so that the material overlying the etch stop layer 224D in the logic area 204, i.e., portions of the first insulating layer 254, the second conductive layer 256 and the conductive contact plate 211 may be removed by performing one or more etching processes.

Next, as shown in FIG. 3Q, another copper-based metallization system comprising metal line M4 and via V3 are formed using known techniques. Note that the bottom surface 211B of the conductive contact plate 211 is above the upper surface 275 of the metallization layer comprising the metal line M3. Thus, the present disclosure provides for embedded copper contacts formed in low-k dielectric material to various logic devices in the logic area 204 of the device 200. This configuration may provide enhanced performance capabilities for the device 200. Additionally, the presence of the low-k material adjacent the memory array is not detrimental to function or capacity of the capacitors 210 due to the presence of the trench 213 which assists in isolating the capacitors 210 in the memory array 206 from other surrounding structure, including the low-k dielectric material in the logic area 204. The device and methods disclosed herein also provides for the capacitors 210 to be comprised of a non-low-k dielectric material, thereby tending to enhance the performance of the capacitors 210.

Ideally, the thickness 281 of the etch stop material above the logic area 204 and the thickness 282 of the etch stop material above the memory array 206 should be approximately the same to facilitate further processing. Thus, as shown in FIG. 3Q, an etch stop layer 224F may then be formed over the logic area 204 and the memory array 206. The etch stop layer 224F may be comprised of materials similar to the other etch stop layers described previously. In one illustrative example the thicknesses 281, 282 may be approximately 15-50 nm. This thickness similarity may be achieved by at least two alternative techniques. First, the remaining portions of the etch stop layer 224D may be removed and the additional etch stop layer 224F may be formed to the desired thickness above both the logic area 204 and the memory array 206. Alternatively, if portions of the etch stop layer 224D above the logic area 204 remain in place when a subsequent etch stop layer 224F is formed over both the logic area 204 and the memory array 206, then a thinning process may be performed to reduce the thickness of the etch stop material above the logic area 204 to the desired thickness 281.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a plurality of low-k dielectric layers within a logic area and a memory array of a semiconductor device;
    forming an etch stop layer above said plurality of low-k dielectric layers;
    forming a plurality of copper metallization layers that are conductively coupled to a plurality of logic devices in said logic area of said semiconductor device, wherein said copper metallization layers are positioned in said low-k dielectric layers; and
    after forming said plurality of copper metallization layers, forming a plurality of capacitors in a memory array of said semiconductor device, wherein forming said plurality of capacitors comprises:
        forming a plurality of openings in said etch stop layer in the area above said memory array; and
        performing at least one etching process through said openings in said etch stop layer to remove said low-k dielectric layers from within said memory array.

2. The method of claim 1, further comprising forming a trench around said memory array and forming a conductive contact plate that is conductively coupled to said plurality of capacitors, wherein a portion of said conductive contact plate extends into said trench.

3. The method of claim 2, wherein said conductive contact plate extends between said plurality of capacitors in said memory array.

4. The method of claim 1, wherein a material other than a low-k dielectric material is positioned between said plurality of capacitors in said memory array.

5. The method of claim 1, wherein forming said plurality of copper metallization layers comprises forming a plurality of copper lines and copper vias.

6. The method of claim 1, further comprising forming a conductive contact plate that is conductively coupled to said plurality of capacitors, wherein said conductive contact plate has a bottom surface that is at a level that is above a level of an uppermost surface of said plurality of copper metallization layers.

7. The method of claim 1, wherein forming said plurality of capacitors comprises forming a plurality of double sided capacitors.

8. The method of claim 1, wherein said capacitors are formed using a non-low-k dielectric material.

9. A method, comprising:
    forming a plurality of low-k dielectric layers within a logic area and a memory array of a semiconductor device;
    forming an etch stop layer above said plurality of low-k dielectric layers;
    forming a plurality of copper metallization layers that are conductively coupled to a plurality of logic devices in said logic area of said semiconductor device, wherein said copper metallization layers are positioned in said low-k dielectric layers;
    after forming said plurality of copper metallization layers, forming a plurality of capacitors in a memory array of said semiconductor device, wherein forming said plurality of capacitors comprises:
        forming a plurality of openings in said etch stop layer in the area above said memory array; and
        performing at least one etching process through said openings in said etch stop layer to remove said low-k dielectric layers from within said memory array;
    forming a trench around said memory array; and
    forming a conductive contact plate that is conductively coupled to said plurality of capacitors, wherein said conductive contact plate has a bottom surface that is at a level that is above a level of an uppermost surface of said plurality of copper metallization layers, and wherein a portion of said conductive contact plate extends into said trench.

10. The method of claim 9, wherein said capacitors are formed using a non-low k dielectric material.

11. The method of claim 9, wherein a material other than a low-k dielectric material is positioned between said plurality of capacitors in said memory array.

12. A semiconductor device, comprising:
    an area comprising a plurality of logic devices;
    a memory array comprising a plurality of capacitors;

a conductive contact plate conductively coupled to said plurality of capacitors, said conductive contact plate having a bottom surface; and a plurality of copper metallization layers conductively coupled to said logic devices, said plurality of copper metallization layers being positioned at a level that is below a level of said bottom surface of said conductive contact plate, wherein said copper metallization layers are positioned in a plurality of layers of low-k dielectric material, each of which is separated by an etch stop layer within said area comprising logic devices.

13. The device of claim 12, further comprising a trench surrounding said memory array, wherein a portion of said conductive contact plate extends into said trench.

14. The device of claim 13, wherein said trench extends into a dielectric layer positioned above a substrate on which said memory array is positioned and a bottom of said trench does not touch a conductive contact to a memory device in said memory array.

15. The device of claim 12, wherein a material other than a low-k dielectric material is positioned between said plurality of capacitors in said memory array.

16. The device of claim 12, wherein said conductive contact plate extends between said plurality of capacitors in said memory array.

17. The device of claim 12, wherein said plurality of capacitors are double sided capacitors.

18. The device of claim 12, wherein said plurality of copper metallization layers are formed prior to the formation of said plurality of capacitors.

19. The device of claim 12, wherein said capacitors are formed using a non-low-k dielectric material.

20. The device of claim 12, wherein said etch stop layers do not extend into said memory array.

21. A semiconductor device, comprising:

an area comprising a plurality of logic devices;

a memory array comprising a plurality of capacitors, said capacitors being comprised of a non-low-k dielectric material;

a conductive contact plate conductively coupled to said plurality of capacitors, said conductive contact plate having a bottom surface;

a plurality of copper metallization layers conductively coupled to said logic devices, said plurality of copper metallization layers being positioned at a level that is below a level of said bottom surface of said conductive contact plate, wherein said copper metallization layers are positioned in a plurality of layers of low-k dielectric material, each of which is separated by an etch stop layer within said area comprising logic devices; and a trench surrounding said memory array, wherein a portion of said conductive contact plate extends into said trench.

22. The device of claim 21, wherein said trench extends into a dielectric layer positioned above a substrate on which said memory array is positioned and a bottom of said trench does not touch a contact to a memory device in said memory array.

23. The device of claim 21, wherein a material other than a low-k dielectric material is positioned between said plurality of capacitors in said memory array.

24. The device of claim 21, wherein said conductive contact plate extends between said plurality of capacitors in said memory array.

* * * * *